US009847436B2

(12) United States Patent
Chen

(10) Patent No.: US 9,847,436 B2
(45) Date of Patent: Dec. 19, 2017

(54) METHOD FOR MANUFACTURING A SOLAR CELL

(71) Applicant: EAST SUN RISING ENTERPRISE CORPORATION, Hsinchu (TW)

(72) Inventor: Ting-Yu Chen, Hsinchu (TW)

(73) Assignee: EAST SUN RISING ENTERPRISE CORPORATION, Hsinchu (TW)

( * ) Notice: Subject to any disclaimer, the term of this patent is extended or adjusted under 35 U.S.C. 154(b) by 121 days.

(21) Appl. No.: 14/191,713

(22) Filed: Feb. 27, 2014

(65) Prior Publication Data

US 2015/0187967 A1 Jul. 2, 2015

(30) Foreign Application Priority Data

Dec. 31, 2013 (TW) .............................. 102149387 A

(51) Int. Cl.
*H01L 31/18* (2006.01)
*H01L 31/0224* (2006.01)
*H01L 31/0236* (2006.01)
*H01L 31/068* (2012.01)

(52) U.S. Cl.
CPC ........... *H01L 31/022425* (2013.01); *H01L 31/02363* (2013.01); *H01L 31/068* (2013.01); *H01L 31/1804* (2013.01); *Y02E 10/547* (2013.01); *Y02P 70/521* (2015.11)

(58) Field of Classification Search
CPC ..... H01L 31/022441; H01L 31/022425; H01L 31/0224

See application file for complete search history.

(56) References Cited

U.S. PATENT DOCUMENTS

| | | | | |
|---|---|---|---|---|
| 3,936,319 A | * | 2/1976 | Anthony | H01L 21/242 117/40 |
| 4,131,488 A | * | 12/1978 | Lesk | H01L 21/2652 136/255 |
| 4,332,879 A | * | 6/1982 | Pastor | G03F 7/0047 427/126.1 |
| 5,330,584 A | * | 7/1994 | Saga | H01L 31/03529 136/255 |
| 7,943,416 B2 | * | 5/2011 | Scherff | H01L 31/022425 257/E21.218 |
| 2007/0235077 A1 | | 10/2007 | Nagata et al. | |
| 2009/0286347 A1 | * | 11/2009 | Kim | H01L 31/0236 438/72 |

(Continued)

FOREIGN PATENT DOCUMENTS

| | | |
|---|---|---|
| CN | 101315953 A | 12/2008 |
| CN | 101807628 A | 8/2010 |

(Continued)

OTHER PUBLICATIONS

International Search Report and Written Opinion received in Patent Cooperation Treaty Application No. PCT/CN2014/095291, dated Mar. 31, 2015, 12 pages.

(Continued)

*Primary Examiner* — Julia Slutsker

(74) *Attorney, Agent, or Firm* — Haynes and Boone, LLP

(57) ABSTRACT

A method of manufacturing a solar cell, including providing a patterned silicon wafer having a covered area and an uncovered area, and forming at least one electrode layer in the uncovered area in a low-temperature process.

13 Claims, 11 Drawing Sheets

(56) References Cited

U.S. PATENT DOCUMENTS

| | | | |
|---|---|---|---|
| 2013/0078755 A1* | 3/2013 | Liu | H01L 31/1888 |
| | | | 438/69 |
| 2013/0087789 A1* | 4/2013 | Hirose | H01L 31/022425 |
| | | | 257/53 |
| 2013/0167923 A1* | 7/2013 | Nakamura | H01B 1/22 |
| | | | 136/256 |
| 2014/0051202 A1* | 2/2014 | Chen | H01L 31/02168 |
| | | | 438/72 |
| 2014/0083486 A1* | 3/2014 | Kim | H01L 31/046 |
| | | | 136/249 |
| 2014/0145311 A1* | 5/2014 | Olson | H01L 23/52 |
| | | | 257/622 |

FOREIGN PATENT DOCUMENTS

| | | |
|---|---|---|
| CN | 101828267 A | 9/2010 |
| CN | 101840952 A | 9/2010 |
| CN | 102687245 A | 9/2012 |
| CN | 202678326 U | 1/2013 |
| CN | 103329281 A | 9/2013 |
| TW | M416200 U1 | 11/2011 |

OTHER PUBLICATIONS

Office Action and Search Report received in Taiwanese Patent Application No. 102149387, dated Apr. 23, 2015, 18 pages.

\* cited by examiner

METHOD FOR MANUFACTURING A SOLAR CELL

CROSS-REFERENCE TO RELATED APPLICATION AND CLAIM OF PRIORITY

The application claims the benefit of Taiwan Patent Application No. 102149387, filed on Dec. 31, 2013, at the Taiwan Intellectual Property Office, the disclosure of which is incorporated herein in its entirety by reference.

FIELD OF THE INVENTION

The present invention relates to a solar cell and manufacturing methods thereof, and more particularly to forming electrodes on a silicon wafer with a low-temperature process and a structure to strengthen the solar cell.

BACKGROUND OF THE INVENTION

The solar cell industry has been developing for more than a half-century. Please refer to FIG. 1 and FIG. 2, which show a conventional solar cell structure 100 and manufacturing flow chart 200. The flow chart 200 includes the texturing process (step 21), diffusion process (step 22) and metallization process (step 23). A silicon wafer 110 is cleaned, and then a texturing process (step 21) and a diffusion process (step 22) are performed on the silicon wafer 110 to form a textured structure 140 with dopants. The conventional metallization process uses silver paste 120 as a material for the electrodes and fabricates the electrodes on the textured structure 140 using screen printing. The silicon wafer is put in a furnace to be heated at a temperature in a range of 700~800° C. in order to enable the silicon powders in the silver paste to tightly combine with the silicon wafer.

Although it is a simple fabrication process to fabricate electrodes with silver paste using screen printing, the silicon wafer needs to be heated in the furnace at a high temperature in the process. The high temperature in the furnace causes dopants in the silicon wafer to diffuse again, which changes the doping concentration in the silicon wafer and also lowers the conversion efficiency of the solar cell.

In addition, the cost of the silicon substrate in the solar cell is a large portion of the overall cost of the solar cell, so the solar cell industry typically reduces the thickness of the silicon substrate to reduce the cost. The current thin solar cells have a thickness in a range of 120 μm~150 μm. However, the thin solar cells are easy to crack during transferring to and soldering at the module manufacturer. Any cracked solar cells on the module need to be replaced manually which further increases the costs.

In order to overcome the drawbacks in the prior art, a method for manufacturing a solar cell is disclosed. The particular design in the present invention not only solves the problems described above, but also is easy to implement. Thus, the present invention has the utility for the industry.

SUMMARY OF THE INVENTION

In accordance with an aspect of the present invention, a method of manufacturing a solar cell is provided. This method of manufacturing a solar cell includes providing a patterned silicon wafer having a covered area and an uncovered area, and forming at least one electrode layer in the uncovered area.

In accordance with an aspect of the present invention, a solar cell is provided. The solar cell includes a silicon wafer and a patterned layer configured on the silicon wafer to define an uncovered area, and at least one electrode layer formed in the uncovered area.

In accordance with an aspect of the present invention, a solar cell is provided. The solar cell includes a silicon wafer having a bus bar with one end connected to a corresponding end of another solar cell's bus bar, and a transparent material covering the silicon wafer except for the one end thereof.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENTS

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
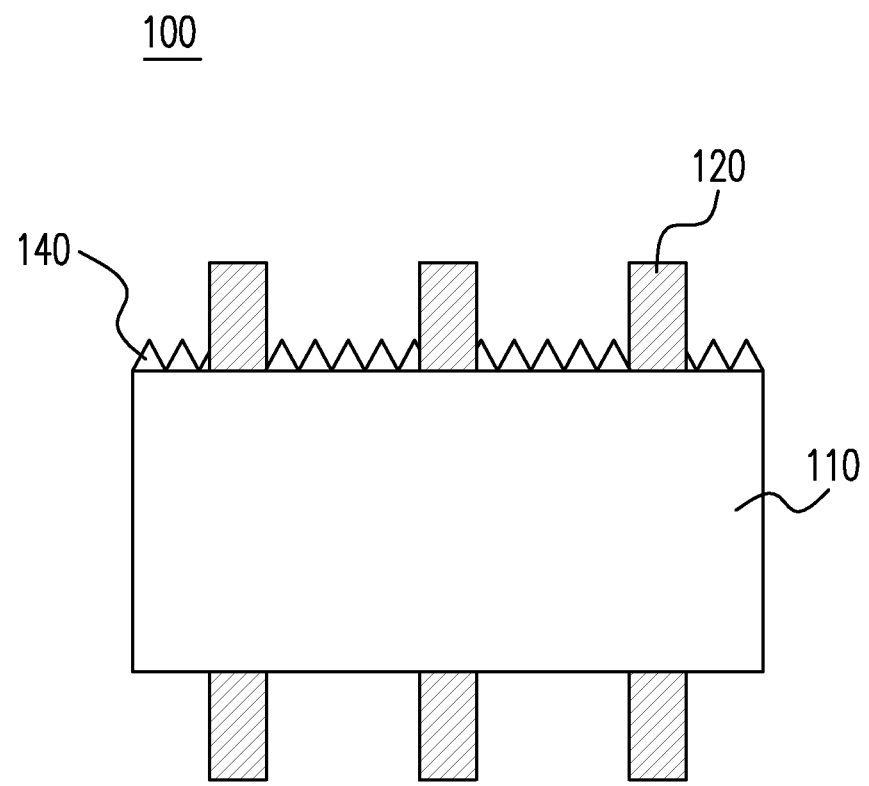
FIG. 1 is a schematic diagram of the structure of a conventional solar cell.
Figure 2:
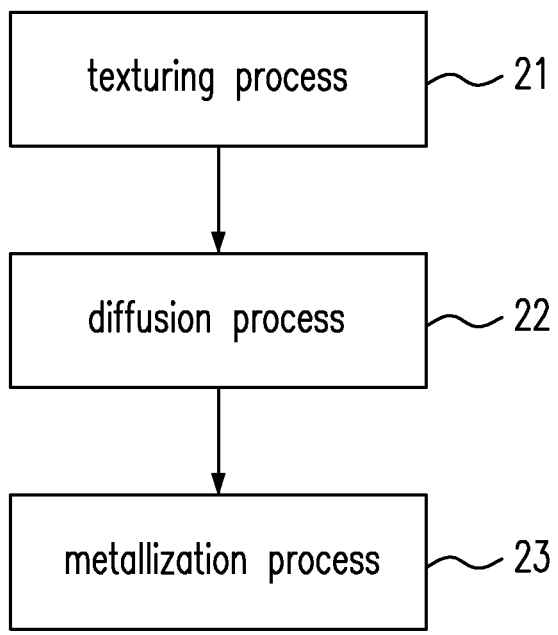
FIG. 2 is a manufacturing flow chart for a conventional solar cell.
Figure 3A:
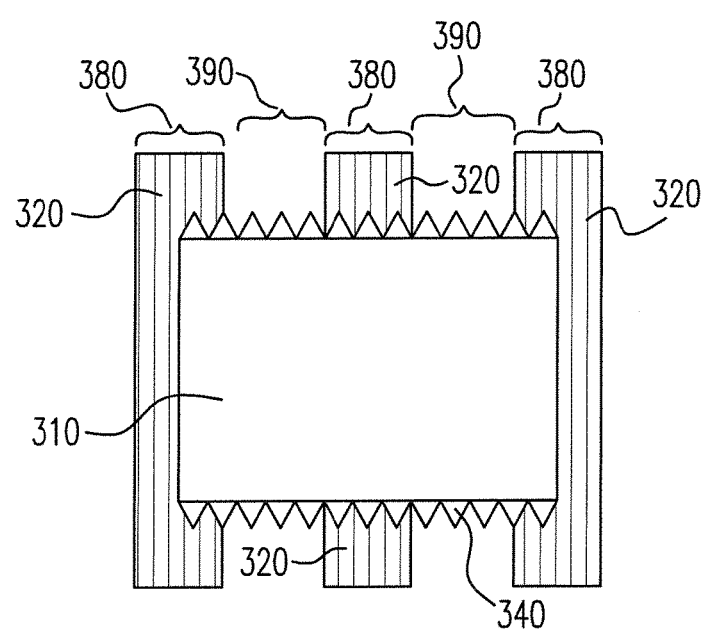
FIGS. 3(a) and 3(b) are schematic diagrams of structures of the first embodiment of the solar cell of the present invention.
Figure 3B:
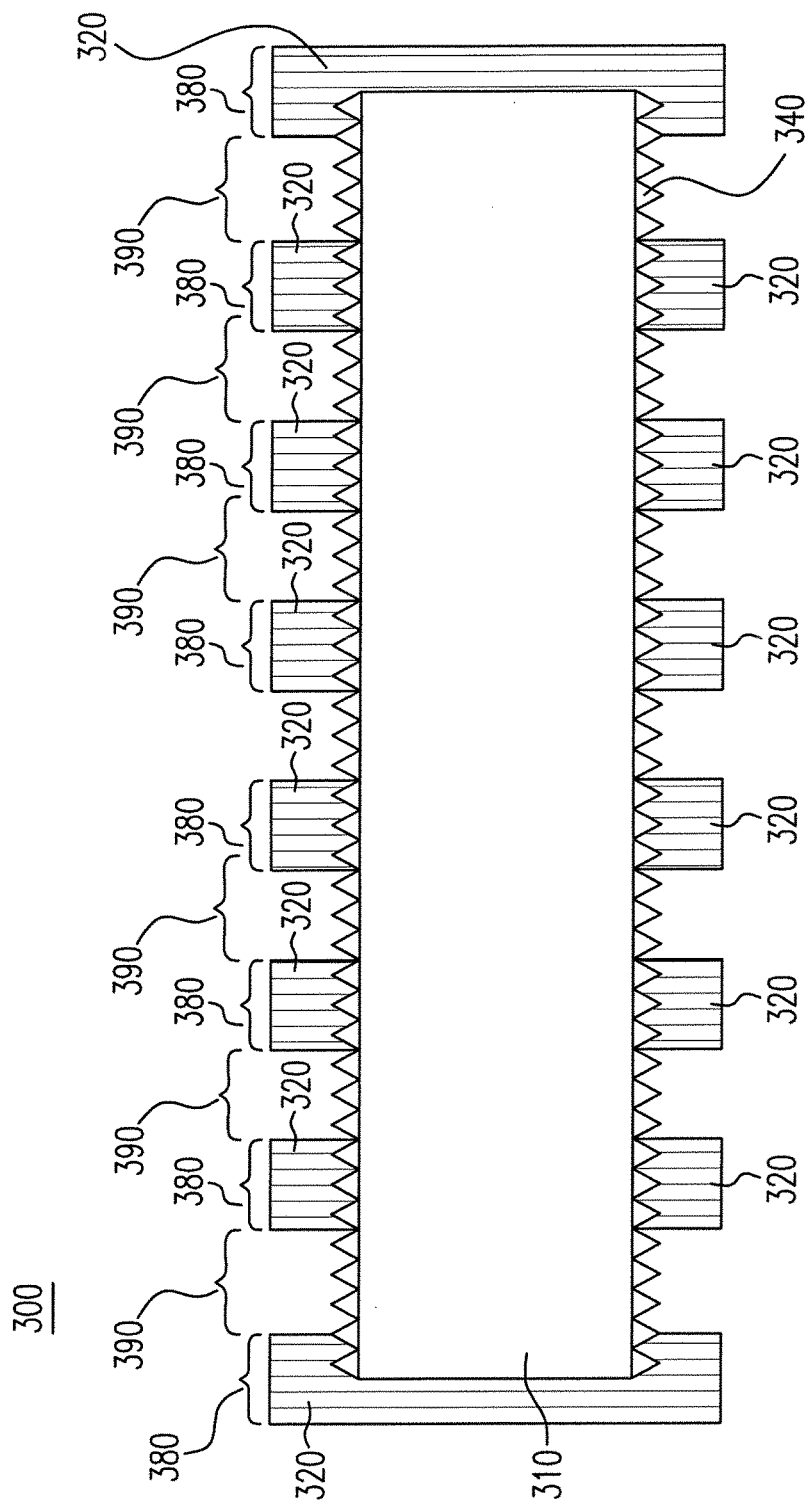
Figure 4:
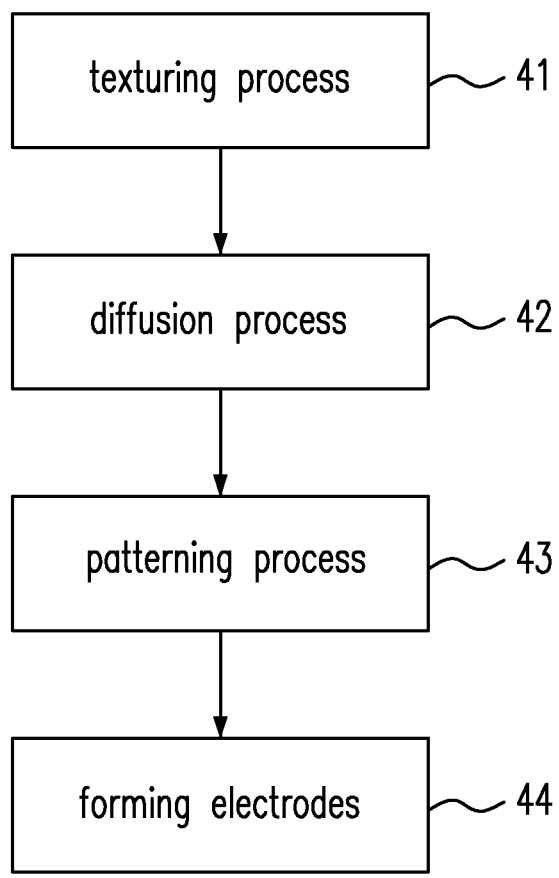
FIG. 4 is a manufacturing flow chart for the first embodiment of the solar cell of the present invention.
Figure 5:
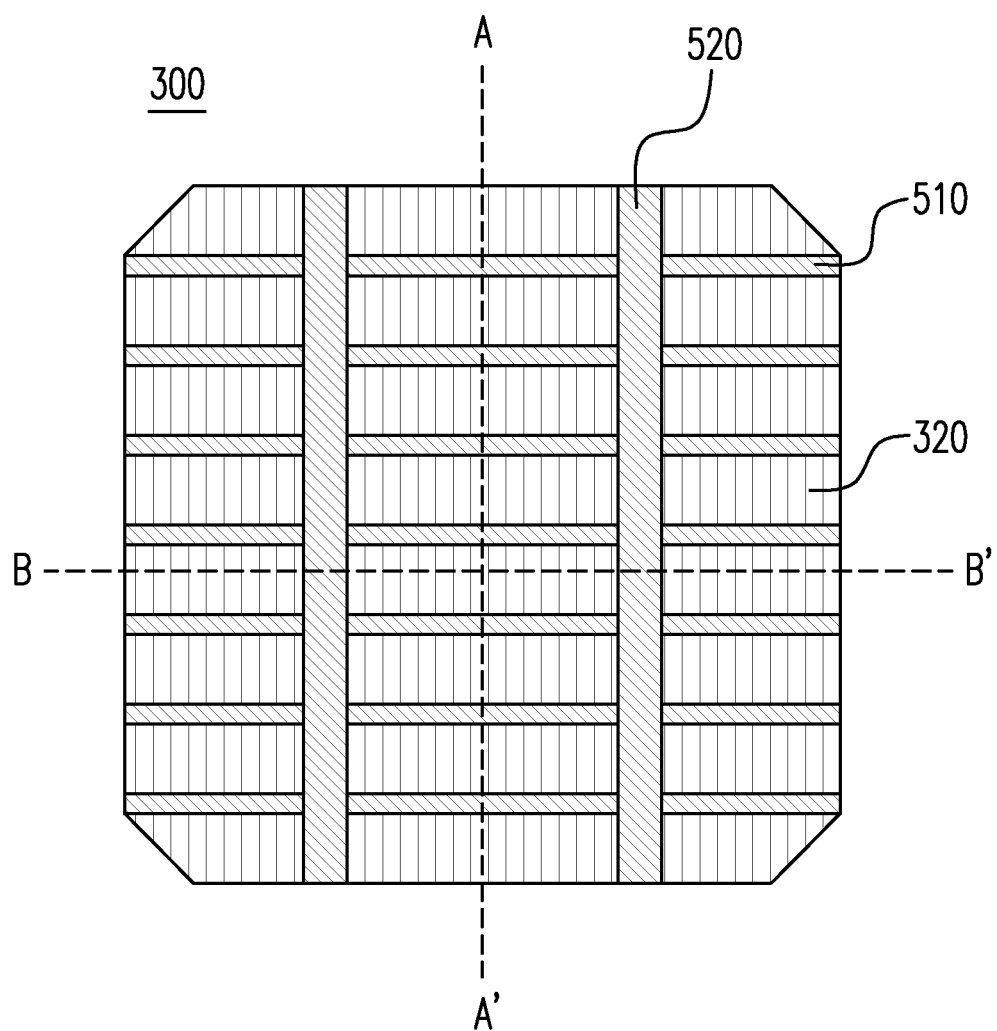
FIG. 5 is a schematic diagram of the top view of the first embodiment of the solar cell of the present invention.

Please refer to FIGS. 3(a), 3(b), 4 and 5. FIGS. 3(a), 3(b) and 5 are schematic diagrams of the structure of the first embodiment of the solar cell 300 of the present invention (electrodes 510 and 520 (mentioned later) are not shown in FIGS. 3(a) and 3(b)). The structure of FIG. 3(a) is the cross-section along the B-B' direction in FIG. 5 and the structure of FIG. 3(a) is the cross-section along the A-A' direction in FIG. 5. It is to be noted that the quantity of electrodes in the Figures is just one of the embodiments. The skilled person in the art can derive other embodiments according to the embodiments disclosed in the present invention, and these embodiments all fall under the disclosure of the present invention. Please refer to FIG. 4. FIG. 4 is the manufacturing flow chart 400 of the first embodiment of the solar cell of the present invention. The manufacturing flow chart 400 is a method of manufacturing the solar cell. By referring to FIGS. 3(a), 3(b) and 5, after performing a texturing process (step 41) and a diffusion process (step 42) on a silicon wafer blank 310, a textured structure 340 is formed on a silicon wafer blank 310. The thickness of the silicon wafer blank 310 is preferably in a range of 50 µm~200 µm. Then a patterning process (step 43) is performed on the textured structure 340, which creates the textured structure 340 having a covered area 380 and an uncovered area 390, and the electrodes 510 and 520 (mentioned later) are formed on the uncovered area 390 (step 44). The thickness of the covered area 380 is preferably in a range of 30 µm~200 µm. The patterning process of step 43 separates the silicon wafer treated by the diffusion process into an area with patterning material (covered area 380) and another area without patterning material (uncovered area 390) and enables electrodes 510 and 520 to be formed on the area without the patterning material.

Please refer to FIG. 5, which shows a schematic diagram of the top view of the first embodiment of the solar cell 300 (whose electrodes are shown) of the present invention. The electrodes include finger electrodes 510 and bus bars 520. Preferably, each of the finger electrodes 510 has a width of more than 5 µm and the finger electrodes have a quantity more than 60. Each of the bus bars 520 has a width in a range of 0.15 mm~2 mm and the bus bars have a quantity being less than 50. The electrodes can only include one finger electrode 510 and one bus bar 520.

With the solar cell 300 mentioned above, the diffusion process (step 42) can be replaced with the Chemical Vapor Diffusion (CVD) process or Heterojunction with Intrinsic Thin layer (HIT) process.

With the solar cell 300 mentioned above, the electrodes can be configured without the bus bars 520. In other words, the bus bars 520 can have a quantity of 0.

With the manufacturing method mentioned above, the patterning process is preferably performed with an acid-alkaline resistant material 320 being one selected from the group consisting of silicone, photoresist and a combination thereof. Patterning with the acid-alkaline resistant material 320 can prevent the patterned pattern from being eroded by the acid-alkaline solvent while the electrode is formed. The patterning process is performed by one selected from the group consisting of a screen printing process, an ink jet printing process, a photolithography and a combination thereof.

Figure 6:
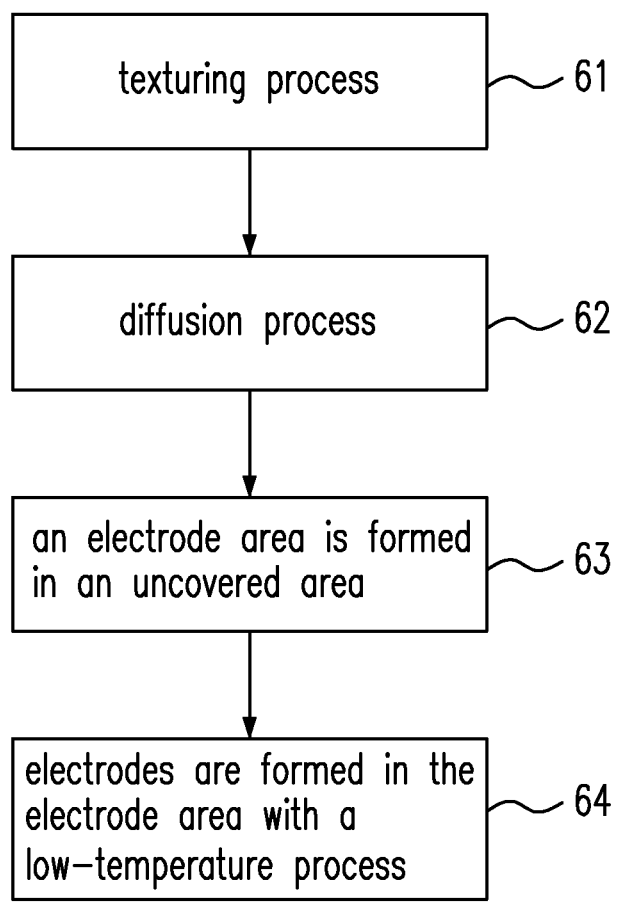
FIG. 6 is a manufacturing flow chart for the second embodiment of the solar cell of the present invention.

Please refer to FIG. 6, which shows the manufacturing flow chart 600 of the second embodiment of the solar cell of the present invention. The manufacturing flow chart 600 is a method for manufacturing the solar cell. After performing a texturing process (step 61) and a diffusion process (step 62) on a silicon wafer, a patterning process is performed on the silicon wafer with a non-conductive material to form a material area. The material area has a thickness in a range of 30 µm~200 µm and preferably the silicon wafer has a thickness in a range of 50 µm~200 µm. An electrode area is formed in an uncovered area (step 63) correspondingly and electrodes are formed in the electrode area with a low-temperature process (step 64).

With the manufacturing method mentioned above, the diffusion process (step 62) can be replaced with the Chemical Vapor Diffusion (CVD) process or Heterojunction with Intrinsic Thin layer (HIT) process.

With the manufacturing method mentioned above, the electrodes preferably include finger electrodes and bus bars. Preferably, each of the finger electrodes has a width more than 5 µm and the finger electrodes have a quantity of more than 60. Each of the bus bars has a width in a range of 0.15 mm~2 mm and the bus bars have a quantity being less than 50. The electrodes can only include one finger electrode and one bus bar.

With the manufacturing method mentioned above, the low-temperature process is one selected from the group consisting of an electrodeposition, a coating process, a chemical vapor deposition, a physical vapor deposition and a combination thereof. The material of the electrodes is one selected from the group consisting of copper, silver, tin, nickel, aluminum, titanium, activated carbon, conducting polymer and a combination thereof according to its application, and the solar cell has a temperature in a range of 0~45° C. during the low-temperature process. Conventional silver paste is not used in this manufacturing method, so there are two advantages. First, a material with a lower price can be chosen to lower the production cost, and second, possible problems with the solar cell caused by the high temperature in the furnace and other potential risks can be avoided.

Figure 8:
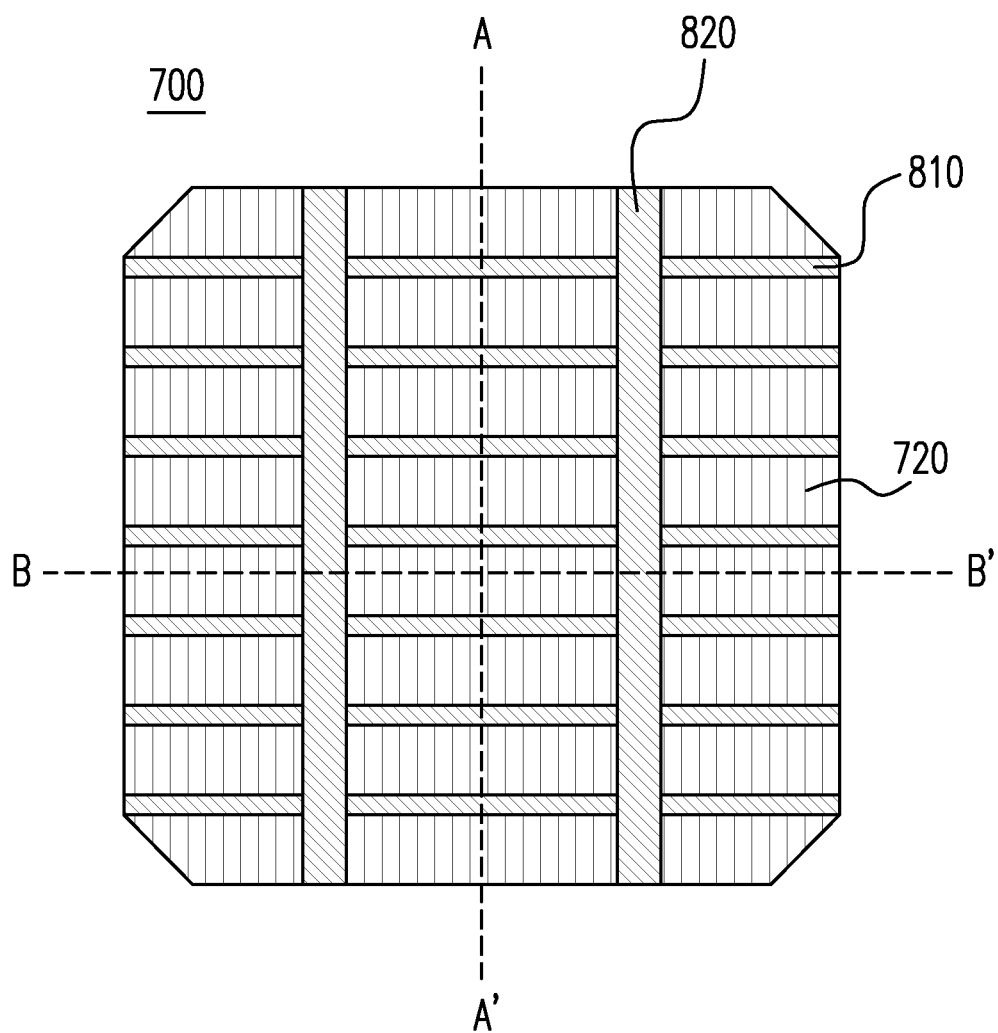
FIG. 8 is a schematic diagram of the top view of the second embodiment of the solar cell of the present invention.

Please refer to FIG. 8, which shows a schematic diagram of the top view of the second embodiment of the solar cell 700 of the present invention. Preferably, the electrode layer includes finger electrodes 810 and bus bars 820. Each of the finger electrodes 810 has a width more than 5 µm and the finger electrodes 810 have a quantity of more than 60. Each of the bus bars 820 has a width in a range of 0.15 mm~2 mm and the bus bars 820 have a quantity of less than 50. The electrodes can only include one finger electrode 810 and one bus bar 820.

Figure 7A:
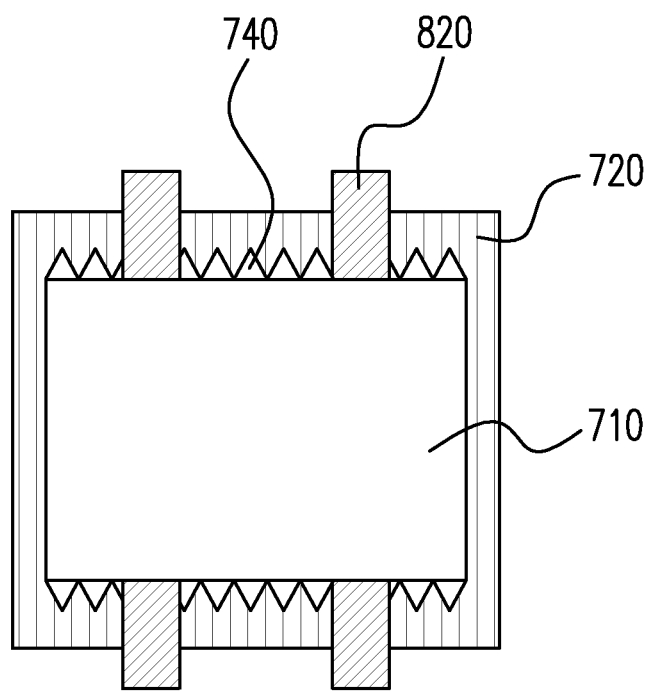
FIGS. 7(a) and 7(b) are schematic diagrams of structures of the second embodiment of the solar cell of the present invention.
Figure 7B:
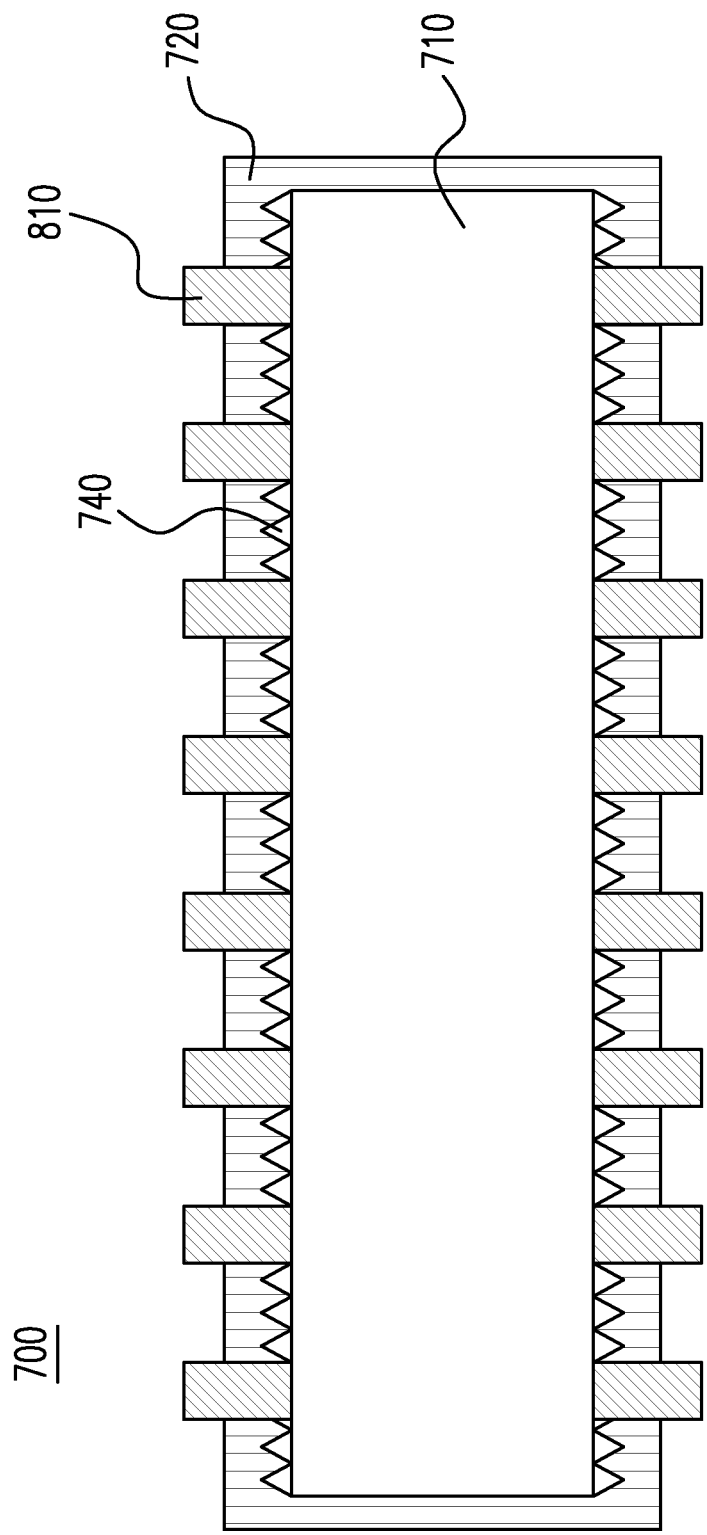

Please refer to FIGS. 7(a) and 7(b), which show a schematic diagram of the structure of the second embodiment of the solar cell 700 of the present invention. The structure of FIG. 7(a) is the cross-section along the B-B' direction in FIG. 8 and the structure of FIG. 7(a) is the cross-section along the A-A' direction in FIG. 8. The solar cell 700 includes a silicon wafer 710 preferably having a thickness in a range of 50 µm~200 µm, a patterned layer 720, a electrode layer including bus bars 820 and finger electrodes 810, and a textured structure 740 with doped dopants. The patterned layer 720 preferably has a thickness in a range of 30 µm~200 µm and is configured on the textured structure 740 to relatively define an uncovered area, and the electrode layer is formed in the uncovered area.

As with the solar cell 700 mentioned above, the electrode layer can be configured without the bus bars 820. In other words, the bus bars 820 can have a quantity of 0.

Preferably, the patterned layer 720 is formed on the textured structure 740 using a patterning process selected from the group consisting of a screen printing process, an ink jet printing process, a photolithography and a combination thereof, and the electrode layer is formed in the uncovered area by an electrodeposition, a coating process, a chemical vapor deposition, a physical vapor deposition and a combination thereof.

Figure 9:
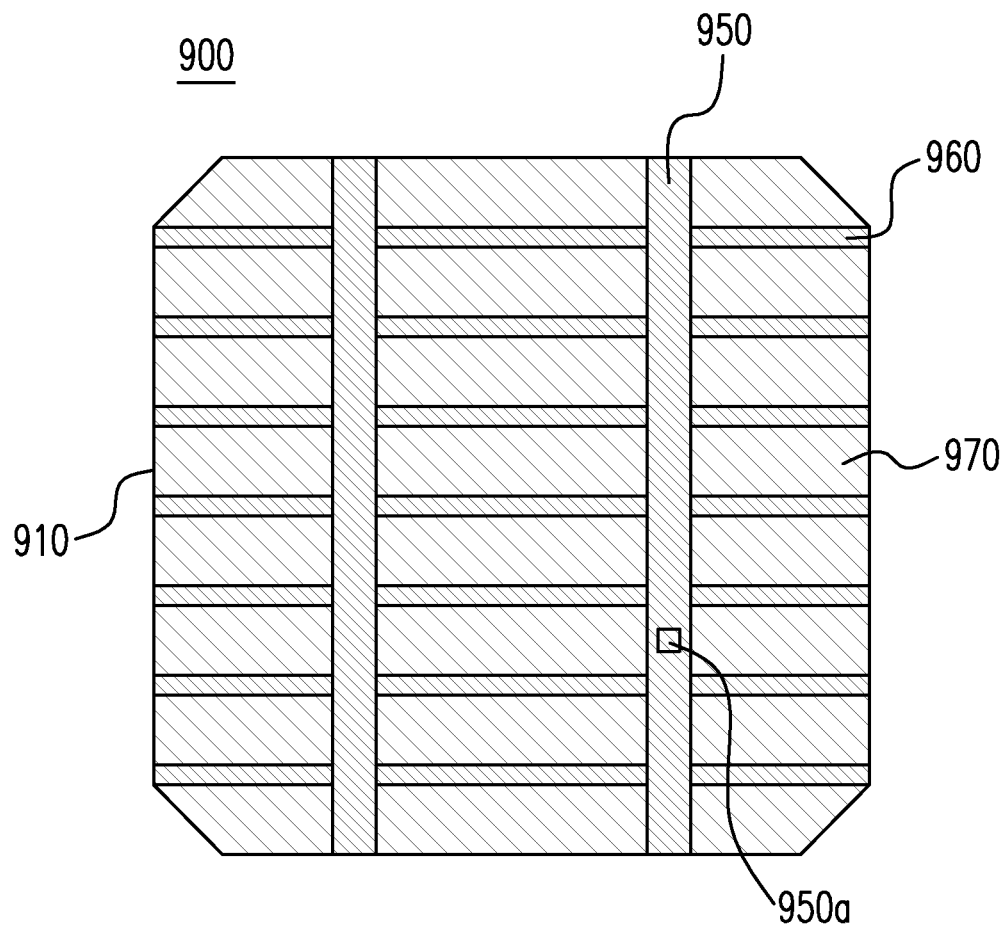
FIG. 9 is a schematic diagram of the top view of the third embodiment of the solar cell of the present invention.

Please refer to FIG. 9, which shows a schematic diagram of the top view of the third embodiment of the solar cell 900 of the present invention. The solar cell 900 includes a silicon wafer 910 having a bus bar 950, a finger electrode 960 and a transparent material 970. The transparent material 970 covers the silicon wafer 910 except for the bus bar 950 and finger electrode 960. The structure of the solar cell 900 will be strengthened after being covered by the transparent material, which also makes the solar cell 900 resistant to cracking during transport and packaging. In addition, the thickness of the silicon substrate of the solar cell 900 can be reduced to lower the cost. Furthermore, because the transparent material covering on the solar cell 900, there is refraction and reflection on the surface of the solar cell, so operators can sort out defective solar cells before modulizing the solar cells, which significantly reduces the problem of chromatic aberration after packaging, and the final product will be appealing and more valuable.

Preferably, the transparent material 970 covers the silicon wafer 910 except for the bus bar 950.

Preferably, the bus bar 950 of the solar cell 900 has one end soldered to another solar cell's bus bar and the transparent material 970 covers the silicon wafer 910 except for this one end.

Preferably, the bus bar 950 of the solar cell 900 has a soldering point 950a and the transparent material 970 covers the silicon wafer 910 except for the soldering point 950a. A skilled person in the art knows that the soldering point 950a is used to solder another solar cell's soldering point and can be configured at any place on the bus bar, and can be any shape or size, and is in no way limited to what is shown in FIG. 9.

With the solar cell 900 mentioned above, the transparent material 970 is one selected from the group consisting of ethylene vinyl acetate (EVA), silicone, photoresist and a combination thereof. In addition, the transparent material matches the EVA and bubbles will not form in the transparent material during the aging test.

With the solar cell 900 mentioned above, the transparent material 970 has a transmittance being more than 85% and can be bonded with the EVA. In addition, the transparent material is selected according to the absorption spectrum of the solar cell such that the conversion efficiency of the solar cell will not be affected by the transparent material covering.

Based on the above, the present invention discloses a solar cell and manufacturing method thereof. The present invention breaks through the conventional method of using the silver paste as a material in the solar cell's metallization process where the silicon wafer will be put into a high-temperature furnace. In the present invention, the silicon wafer is patterned with an acid-alkaline resistant material which enables the silicon wafer to have a covered area and an uncovered area. After the patterning process, the material will remain on the silicon wafer without being removed at any point in the manufacturing process. Then, forming electrodes in the uncovered area with a low-temperature process prevents the problems and potential risks caused by the high temperature and also increases the conversion efficiency of the solar cell. In addition, a transparent material covers the solar cell except for the bus bar, which increases the strength of the solar cell and overcomes the problem of being easily cracked in thin solar cells. The thickness of the solar cell can be reduced to lower the production cost. The transparent material formed on the silicon wafer can withstand the UV light for more than five years without coming off, embrittling, blurring or yellowing. The operators can examine any problems with chromatic aberration before packaging so that the final product will be appealing and more valuable. The acid-alkaline resistant material and the transparent material are selected from materials which bonds well with each other, which further increases integration of the components.

Embodiments

1. A method for manufacturing a solar cell comprises providing a patterned silicon wafer having a covered area and an uncovered area, and forming at least one electrode layer in the uncovered area.
2. A method for manufacturing the solar cell of Embodiment 1, the providing step further comprising steps of: providing a silicon wafer blank, performing a diffusion process on the silicon wafer blank and patterning the silicon wafer blank to obtain the patterned silicon wafer.
3. A method for manufacturing the solar cell of any one of Embodiments 1-2, wherein the silicon wafer blank has a first thickness in a range of 50 µm~200 µm and the covered area has a second thickness being in a range of 30 µm~200 µm.
4. A method for manufacturing the solar cell of any one of Embodiments 1-3, wherein the patterning step further comprises a step of patterning the silicon wafer blank with an acid-alkaline resistant material being one selected from the group consisting of silicone, photoresist and a combination thereof.
5. A method for manufacturing the solar cell of any one of Embodiments 1-4, wherein the patterning process is performed by one selected from the group consisting of a screen printing process, an ink jet printing process, a photolithography and a combination thereof.
6. A method for manufacturing the solar cell of any one of Embodiments 1-5, further comprising a step of forming the at least one electrode layer with a low-temperature process.
7. A method for manufacturing the solar cell of any one of Embodiments 1-6, wherein the low-temperature process is one selected from the group consisting of an electrodeposition, a coating process, a chemical vapor deposition, a physical vapor deposition and a combination thereof.
8. A method for manufacturing the solar cell of any one of Embodiments 1-7, wherein the solar cell has a temperature in a range of 0~45° C. during the low-temperature process.
9. A method for manufacturing the solar cell of any one of Embodiments 1-8, wherein the at least one electrode layer is one selected from the group consisting of copper, silver, tin, nickel, aluminum, titanium, activated carbon, conducting polymer and a combination thereof.
10. A method for manufacturing the solar cell of any one of Embodiments 1-9, wherein the at least one electrode layer comprises at least one finger electrode and the at least one finger electrode with a first width of more than 5 µm.
11. A method for manufacturing the solar cell of any one of Embodiments 1-10, wherein the at least one electrode layer further comprises at least one bus bar, the at least one bus bar has a second width in a range of 0.15 mm~2 mm, the at least one finger electrode has a first quantity of more than 60 and the at least one bus bar has a second quantity of less than 50.
12. A solar cell comprises a silicon wafer and a patterned layer configured on the silicon wafer to define an uncovered area, and at least one electrode layer formed in the uncovered area.
13. The solar cell of Embodiment 12, wherein the silicon wafer has a first thickness in a range of 50 µm~200 µm and the patterned layer has a second thickness in a range of 30 µm~200 µm.
14. The solar cell of any one of Embodiments 12-13, wherein the at least one electrode layer comprises at least one finger electrode and the at least one finger electrode has a first width being more than 5 µm.
15. The solar cell of any one of Embodiments 12-14, wherein the at least one electrode layer further comprises at least one bus bar, the at least one bus bar has a second width being in a range of 0.15 mm~2 mm, the at least one finger electrode has a first quantity of more than 60, and the at least one bus bar has a second quantity of less than 50.

16. A solar cell comprises a silicon wafer having a bus bar with one end connected to a corresponding end of another solar cell's bus bar, and a transparent material covering the silicon wafer except for the one end thereof.

17. The solar cell of Embodiment 16, wherein the one end has a soldering point soldered to another solar cell's soldering point.

18. The solar cell of any one of Embodiments 16-17, wherein the transparent material is one selected from the group consisting of ethylene vinyl acetate (EVA), silicone, photoresist and a combination thereof.

19. The solar cell of any one of Embodiments 16-18, wherein the transparent material has a transmittance being more than 85% and is bonded with the EVA.

20. The solar cell of any one of Embodiments 16-19, further comprising an absorption spectrum, wherein the transparent material is selected according to the absorption spectrum.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a solar cell, comprising:
   providing a patterned silicon wafer having a covered area and an uncovered area through a patterning process, wherein the patterned silicon wafer is patterned with a transparent photoresist of at least one of being acid-resistant and alkaline-resistant, and the patterned transparent photoresist remains on the silicon wafer for at least five years after the patterning process; and
   forming at least one electrode layer in the uncovered area.

2. The method as claimed in claim 1, the providing step further comprising steps of:
   providing a silicon wafer blank;
   performing a diffusion process on the silicon wafer blank; and
   patterning the silicon wafer blank to obtain the patterned silicon wafer.

3. The method as claimed in claim 2, wherein the silicon wafer blank has a first thickness in a range of 50 µm~200 µm and the covered area has a second thickness in a range of 30 µm~200 µm.

4. The method as claimed in claim 2, wherein the patterning step further comprises a step of patterning the silicon wafer blank with an acid-alkaline resistant material being one selected from the group consisting of silicone, photoresist and a combination thereof.

5. The method as claimed in claim 2, wherein the patterning process is performed by one selected from the group consisting of a screen printing process, an ink jet printing process, a photolithography and a combination thereof.

6. The method as claimed in claim 1, further comprising a step of forming the at least one electrode layer with a low-temperature process having a temperature setting lower than 300° C.

7. The method as claimed in claim 6, wherein the low-temperature process is one selected from the group consisting of an electrodeposition, a coating process, a chemical vapor deposition, a physical vapor deposition and a combination thereof.

8. The method as claimed in claim 6, wherein the solar cell has a temperature in a range of 0~45° C. during the low-temperature process.

9. The method as claimed in claim 1, wherein the at least one electrode layer is one selected from the group consisting of copper, silver, tin, nickel, aluminum, titanium, activated carbon, conducting polymer and a combination thereof.

10. The method as claimed in claim 1, wherein the at least one electrode layer comprises at least one finger electrode, and the at least one finger electrode has a first width of more than 5 µm.

11. The method as claimed in claim 10, wherein the at least one electrode layer further comprises at least one bus bar, and the at least one bus bar has a second width in a range of 0.15 mm~2 mm.

12. A method for manufacturing a solar cell, comprising:
    providing a silicon wafer;
    forming a pattern on the silicon wafer through a patterning process with a transparent photoresist which is at least one of being acid-resistant and alkaline-resistant, wherein the patterning process separates the silicon wafer into a covered area and an uncovered area and wherein the pattern remains on the silicon wafer for at least five years after the patterning process; and
    forming at least one electrode in the uncovered area.

13. A method for manufacturing a solar cell having an absorption spectrum, comprising:
    providing a silicon wafer;
    forming a pattern on the silicon wafer through a patterning process with a photoresist which is at least one of being acid-resistant and alkaline-resistant, is transparent to the absorption spectrum and has a transmittance being more than 85%, wherein the patterning process separates the silicon wafer into a covered area and an uncovered area and wherein the patterned photoresist remains on the silicon wafer for at least five years after the patterning process; and
    forming at least one electrode in the uncovered area.

* * * * *